United States Patent
Ono et al.

(10) Patent No.: US 7,421,357 B2
(45) Date of Patent: Sep. 2, 2008

(54) INSPECTION DATA ANALYSIS PROGRAM, INSPECTION TOOLS, REVIEW APPARATUS AND YIELD ANALYSIS APPARATUS

(75) Inventors: Makoto Ono, Yokohama (JP); Yohei Asakawa, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/887,827

(22) Filed: Jul. 12, 2004

(65) Prior Publication Data

US 2005/0021268 A1 Jan. 27, 2005

(30) Foreign Application Priority Data

Jul. 23, 2003 (JP) ............................. 2003-200189

(51) Int. Cl.
    *G06F 19/00* (2006.01)
    *G01R 31/26* (2006.01)
(52) U.S. Cl. .......................... 702/81; 438/14; 700/108
(58) Field of Classification Search ......... 700/108–110, 700/121; 702/81–84; 438/14
See application file for complete search history.

(56) References Cited

U.S. PATENT DOCUMENTS

| | | | |
|---|---|---|---|
| 6,128,403 A | 10/2000 | Ozaki | |
| 6,150,023 A * | 11/2000 | Yasaka et al. | 428/408 |
| 6,289,257 B1 | 9/2001 | Sekine | |
| 6,314,379 B1 * | 11/2001 | Hu et al. | 702/81 |
| 6,341,241 B1 | 1/2002 | Mugibayashi et al. | |
| 2002/0002415 A1 * | 1/2002 | Mugibayashi et al. | 700/110 |
| 2002/0183889 A1 * | 12/2002 | Sakakibara | 700/180 |

FOREIGN PATENT DOCUMENTS

JP      2002-299401      10/2002

OTHER PUBLICATIONS

"Non-Defective Area Analysis for Quantifying Yield Impact", by M. Ono, et al, 1999, IEEE International Symposium on Semiconductor Manufacturing, Proceedings, pp. 127-130.
European Search Report dated Feb. 3, 2006.
Ono, Makoto, et al., Non-Defective Area Analysis for Quantifying Yield Impact, Semiconductor Manufacturing Conference Proceedings, 1999 IEEE International Symposium on Santa Clara, CA, USA, Oct. 11, 1999, pp. 127-130, Piscataway, NJ.

* cited by examiner

*Primary Examiner*—Eliseo Ramos-Feliciano
*Assistant Examiner*—Janet L Suglo
(74) *Attorney, Agent, or Firm*—Antonelli, Terry, Stout & Kraus, LLP.

(57) ABSTRACT

An operation unit executes a process for calling to a main memory first data representative of a result of equipment QC applied to a production unit. A process for reading out to the main memory an amount of change in failure in accordance with particle numbers calculated for individual defect sizes from second inspection data representative of a result of equipment QC is applied to the production unit. Electrical test data of a product processed by the production unit during a period inclusive of the time that the second inspection is carried out is also read to the main memory. A process is also executed for using the amount of change in failure in accordance with the calculated particle numbers and the particle numbers for individual sizes determined from the first inspection data to determine an impact on the product by particles generated in the production equipment when the first inspection data is detected.

1 Claim, 10 Drawing Sheets

FIG.5

EQUIPMENT CODE , EQUIPMENT NAME — 142
    10, INSPECTION DATA ANALYSIS APPARATUS
    11, DEFECT INSPECTION UNIT
    12, ELECTRICAL TESTER
    13, INSPECTION DATABASE UNIT
    14, MES UNIT
    31, NO.1 CVD UNIT
    32, NO.2 CVD UNIT
    41, NO.1 COATING/DEVELOPMENT UNIT
    42, NO.2 COATING/DEVELOPMENT UNIT
    51, NO.1 EXPOSURE UNIT
    52, NO.2 EXPOSURE UNIT
    53, NO.3 EXPOSURE UNIT
    54, NO.4 EXPOSURE UNIT
    61, NO.1 ETCHING UNIT
    62, NO.2 ETCHING UNIT
    63, NO.3 ETCHING UNIT
    71, NO.1 ION PLANTER UNIT
    72, NO.2 ION PLANTER UNIT
    81, NO.1 WASHING UNIT
    82, NO.2 WASHING UNIT
    83, NO.3 WASHING UNIT
    91, NO.1 RESIST REMOVAL UNIT
    92, NO.2 RESIST REMOVAL UNIT
    93, NO.3 RESIST REMOVAL UNIT
    101, NO.1 SPUTTER UNIT
    102, NO.2 SPUTTER UNIT
    111, NO.1 DIFFUSION UNIT
    112, NO.2 DIFFUSION UNIT
    121, NO.1 CPM UNIT
    122, NO.2 CPM UNIT
    131, DIMENSION MEASUREMENT UNIT
    132, FILM THICKNESS MEASUREMENT UNIT
    133, ALIGNMENT INSPECTION UNIT

```
[Header]
PRECEDING INSPECTION DATE AND HOUR  , 2003/02/01 10:00:00
SUCCEEDING INSPECTION DATE AND HOUR, 2003/02/01 18:00:00
UNIT CODE                           , 31
[Data]
ORDINAL         X              Y
NUMBER,    COORDINATES,   COORDINATES,    SIZE(μm)
 0001,        6432,         43798,         0.83
 0002,       15195,         14918,         0.45
 0003,       28111,          7213,         0.05
 0004,       21735,         51613,         0.09
 0005,       35903,         31922,         1.23
 0006,       34510,         56633,         0.54
 0007,       42642,         22310,         0.67
 0008,       53032,         19109,         2.30
```
~143

FIG.9

[header]
PRODUCT NAME,ABC
WAFER ID,A003
NUMBER OF PROCESSES ,520
[define]
DATE AND HOUR, UNIT CODE, PROCESS NAME
[process]
2002/12/05 10:00:00, 111, LOCOS SURFACE OXIDATION
2002/12/05 15:00:00,  32, LOCOS FILM FORMATION
2002/12/06 00:00:00,  42, LOCOS COATING
2002/12/06 02:00:00,  53, LOCOS EXPOSURE
2002/12/06 03:00:00,  42, LOCOS DEVELOPMENT
2002/12/06 08:00:00,  61, LOCOS ETCHING
2002/12/06 10:00:00,  93, LOCOS RESIST REMOVAL
2002/12/06 11:00:00,  82, LOCOS WASHING

⋮

2002/12/25 07:00:00,  83, CONTACT WASHING B
2002/12/25 13:00:00, 101, WIRING 1 SPUTTER
2002/12/25 15:30:00,  81, WIRING 1 WASHING A
2002/12/25 19:00:00,  41, WIRING 1 COATING
2002/12/25 21:00:00,  51, WIRING 1 EXPOSURE
2002/12/25 23:00:00,  41, WIRING 1 DEVELOPMENT
2002/12/26 02:00:00,  62, WIRING 1 ETCHING
2002/12/26 04:30:00,  91, WIRING 1 RESIST REMOVAL
2002/12/26 07:00:00,  83, WIRING 1 WASHING B

[Header]
PRODUCT NAME,ABC
WAFER ID,A003
TEST DATE AND HOUR,2003/01/01/ 10:00:00
[Data]
YIELD,0.83
DEFECT DENSITY, 0.19 pieces/cm2
[Bin-Map]
-, -, -, -, G, G, G, G, G, B, -, -, -, -,
-, -, -, G, G, B, G, G, B, G, B, -, -, -,
-, -, G, B, G, G, B, G, B, G, B, -, -,
-, B, G, G, G, G, G, B, G, G, G, G, -,
-, G, G, B, G, G, G, G, G, G, G, G, -,
G, G, G, G, G, G, G, G, G, G, G, G, G,
G, B, G, B, G, G, G, G, G, G, G, G, B,
B, G, G, G, G, B, G, G, G, B, G, G, G, G,
G, G, G, B, G, G, B, G, G, G, B, G, G, G,
-, G, G, B, G, G, G, G, G, G, G, G, -,
-, G, G, G, B, G, G, G, G, G, B, -,
-, -, B, G, G, G, G, G, G, B, G, -, -,
-, -, -, G, G, G, G, G, B, G, -, -, -,
-, -, -, -, G, G, G, G, G, G, -, -, -, -,

PRODUCT NAME,ABC
CHIP SIZE X,10mm
CHIP SIZE Y,10mm
NON-DEFECTIVE PRODUCT MARK,G
DEFECTIVE PRODUCT MARK,B
CHIP VOID MARK,-
Matrix-X,14
Matrix-Y,14

145 ent or unit is inspected before a wafer is brought into the
INSPECTION DATA ANALYSIS PROGRAM, INSPECTION TOOLS, REVIEW APPARATUS AND YIELD ANALYSIS APPARATUS The present application claims priority from Japanese application JP 2003-200189 filed on Jul. 23, 2003, the content of which is hereby incorporated by reference into this application.

BACKGROUND OF THE INVENTION

The present invention relates to a technique for analyzing inspection data in the manufacturing process of products, such as semiconductor devices, thin film magnetic heads and optical devices, in which particles can cause electrical defects.

A conventional technique will be described, by way of example, for performing an inspection in the manufacturing process of a semiconductor device.

Generally, a semiconductor chip production process is divided into a front-end process in which a plurality of chips, each having a circuit pattern in a unit chip, are multi-layered on a silicon wafer (substrate); and a back-end process in which the chips are diced chip by chip and individual chips are molded into complete products.

Most failures during the production process occur in the front-end process during which time work is performed to create fine features on the chips. It is important to improve the yield in the front-end process in order to reduce production costs. The yield referred to herein signifies the rate of non-defective products determined by the result of an electrical test representing the final test in the front-end process. In other words, it corresponds to the ratio of the number of non-defective chips to the number of all chips on the wafer.

In the front-end process, disconnection or short-circuit takes place in a circuit pattern because of particles generated during the production which degrade the yield.

Accordingly, reduction of particles is important for improving the yield.

To classify roughly, two kinds of inspections are conducted for the purpose of monitoring particles in the front-end production line. A first inspection called an in-line inspection, and a second inspection called an equipment quality control (QC).

In the in-line inspection, a wafer in production for an actual product is inspected on the production line.

Recently, for inspection of a wafer of a product during manufacturing, inconveniences actually caused in the product are monitored and its in-line inspection data is compiled with electrical test data to calculate an impact that particles have on a test object (a final product in the front-end process).

In connection with this procedure, one may refer to, for example, "Non-Defective Area Analysis for Quantifying Yield Impact" by is Ono et al, 1999, IEEE International Symposium on Semiconductor Manufacturing, Proceedings, pp. 127-130.

On the other hand, in the QC of equipments for production, the inspection is performed with attention to keeping the production equipment in good condition. A production equipment or unit is inspected before a wafer is brought into the production equipment and after the wafer is removed from the production equipment to measure a change in inspection results during the production process. Thus, particles and defects occurring in production equipments can be detected periodically for each equipment.

SUMMARY OF THE INVENTION

Typically, processes are conducted using many production equipment before a product reaches an electrical test.

Usually, a semiconductor wafer is processed at least several of tens of times through the production equipment.

If the conventional in-line inspection is to be conducted before and after every production equipment, the number of inspection processes will increase and prolong production time.

Accordingly, the in-line inspection is carried out for each of the plural production processes to perform analysis process by process. When the results show a defect coexistent with various particles and other defects (such as scratches caused during polishing and pattern abnormality due to defocus during exposure) generated in plural production processes that are not involved in the inspection, it is difficult to identify which production step generated the defect.

In the equipment QC, on the other hand, a wafer in production for a product is not used. Rather, a wafer that is dedicated for inspection purposes (the wafer dedicated for inspection is a dummy wafer not formed with a circuit pattern but formed with only a thin film similar to that of a product) is generally used. In case a wafer in production for a product is used for equipment QC, the wafer is not returned to the production line. If returned, however, the wafer is not subjected to any special analysis different from that of a wafer which has not inspected.

Accordingly, the manner in which the result of an electrical test is impacted by the result of an equipment QC conducted for a particular production equipment (i.e., by particles concomitant with the particular production equipment) cannot be grasped.

An object of the present invention is to improve the yield by exhibiting quantitatively an impact on the result of an electrical test by particles generated in a particular production equipment.

The present application includes a plurality of inventions effective to solve the above problems.

According to a representative invention of the present application, correlative coefficients are determined by collating inspection data of equipment QC with results of an electrical test and the correlative coefficients are reflected upon other inspection data of equipment QC to thereby quantitatively determine an impact that particles occurring in a production equipment performing the equipment QC have on the result of the electrical test (in the case of a semiconductor wafer, a final product in the front-end process).

Other objects, features and advantages of the invention will become apparent from the following description of the embodiments of the invention taken in conjunction with the accompanying drawings.

BRIEF DESCRIPTION OF THE DRAWINGS

FIG. 5 is a diagram showing an example of a list of the correspondence between equipment code and equipment name.

FIG. 9 is a diagram showing an example of process history data.

FIG. 10 is a diagram showing an example of electrical test results.

FIG. 11 is a diagram showing an example of incidental data.

DESCRIPTION OF THE INVENTION

A method of calculating an impact on a product by production units used in a front-end process for a semiconductor wafer will be described.

Figure 2:
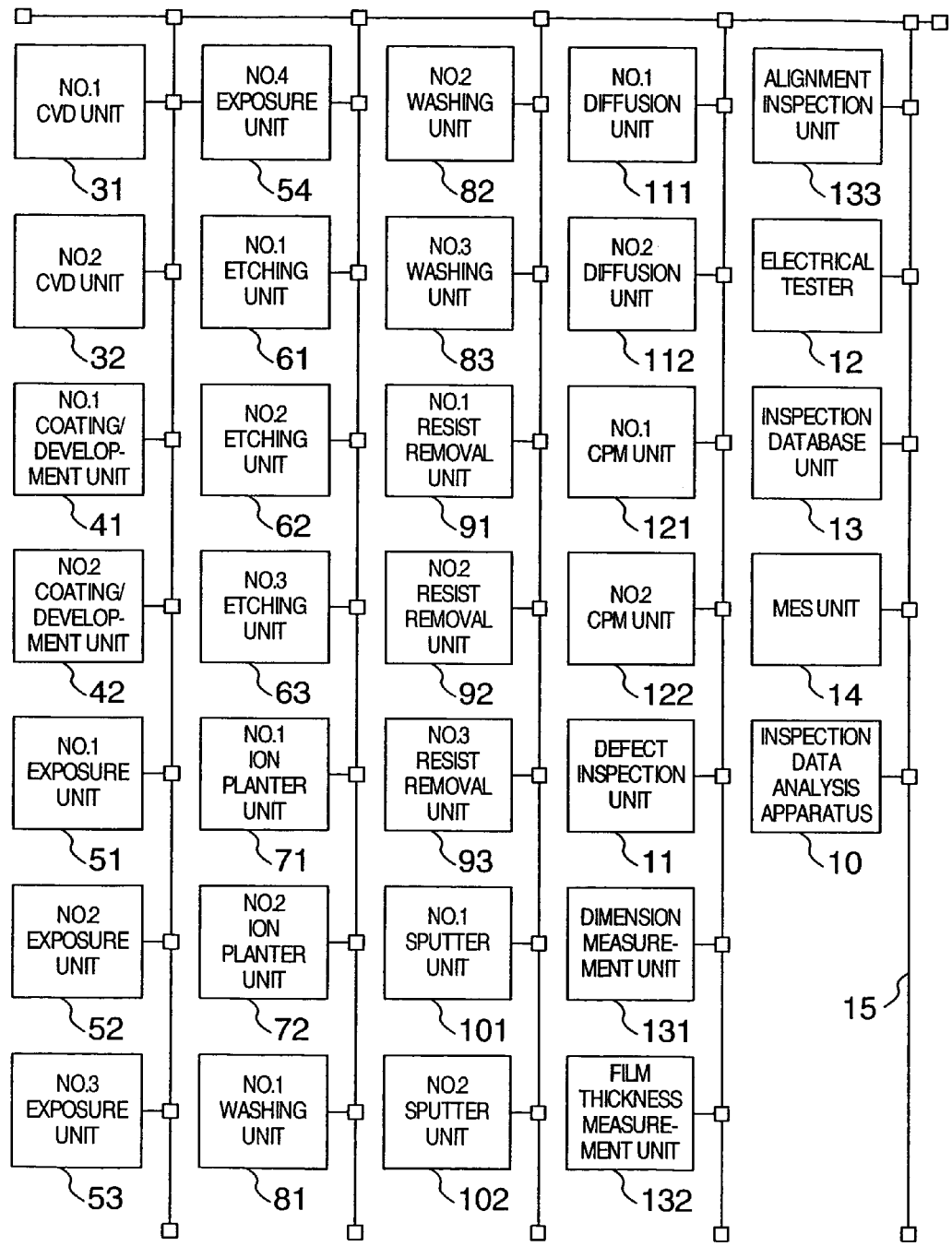
FIG. 2 is a diagram showing an example of blocks of equipments existing in a front-end process production line.

Referring first to FIG. 2, an example of blocks of production equipment existing in the front-end process-production line will be described. FIG. 2 illustrates a No. 1 CVD unit 31, a No. 2 CVD unit 32, a No. 1 coating/development unit 41, a No. 2 coating/development unit 42, a No. 1 exposure unit 51, a No. 2 exposure unit 52, a No. 3 exposure unit 53, a No. 4 exposure unit 54, a No. 1 etching unit 61, a No. 2 etching unit 62, a No. 3 etching unit 63, a No. 1 ion planter unit 71, a No. 2 ion planter unit 72, a No. 1 washing unit 81, a No. 2 washing unit 82, a No. 3 washing unit 83, a No. 1 resist removal unit 91, a No. 2 resist removal unit 92, a No. 3 resist removal unit 93, a No. 1 sputter unit 101, a No. 2 sputter unit 102, a No. 1 diffusion unit 111, a No. 2 diffusion unit 112, a No. 1 CPM unit 121, a No. 2 CPM unit 122, a defect inspection unit 11, a dimension measurement unit 131, a film thickness measurement unit 132, an alignment inspection unit 133, an electrical tester 12, an inspection database unit 13, an MES unit 14 and an inspection data analysis apparatus 10. These units and apparatus are mutually connected through a local area network 15 to perform mutual data transmission.

Figure 3:
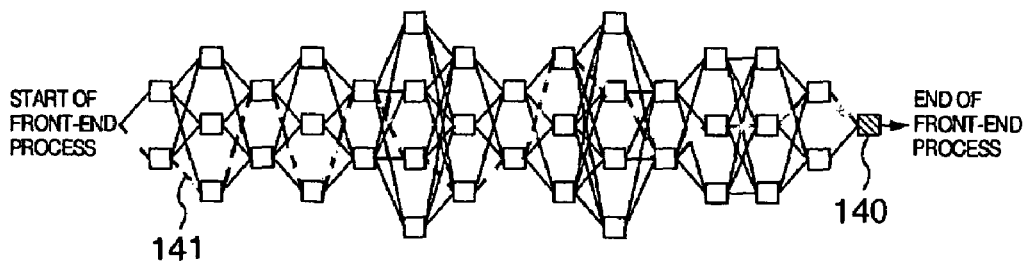
FIG. 3 is a diagram showing an example of a procedure for processing a product wafer.

Referring to FIG. 3, there is illustrated an example of blocks to show a procedure of processing a product wafer in the front-end process production line. In FIG. 3, a wafer is conveyed from left to right. The front-end process ends after going through several of hundreds of steps, although the number of steps can be slightly different depending on the integrated circuits being formed. For convenience of explanation, FIG. 3 is simplified to include 15 steps through which the procedure ends. Square blocks in FIG. 3 depict units, respectively, through which a wafer for forming a product passes. It is signified that at a portion where a plurality of square blocks are aligned vertically, a plurality of units for performing the same step are provided. For example, in FIG. 2, the four exposure units 51 to 54 are available for an exposure step and if any one of them can be in use, four squares are aligned vertically. In other words, one of the tools for the same step is selected to process the wafer. A hatched square block 140 corresponds to an electrical test with the electrical tester 12. In this test, individual product chips formed in the wafer surface are tested to determine whether they are non-defective or defective. For example, a particular wafer completes the front-end process by passing through the various units along the route indicated by dashed line 141. The pass-along units are different for wafers. Process history data capable of specifying routes wafer by wafer is stored in the MES unit 14.

In general, a larger number of tools than the tools shown in FIG. 2 exist in the practical front-end process production line but the illustration is simplified in the present embodiment for convenience.

Figure 1:
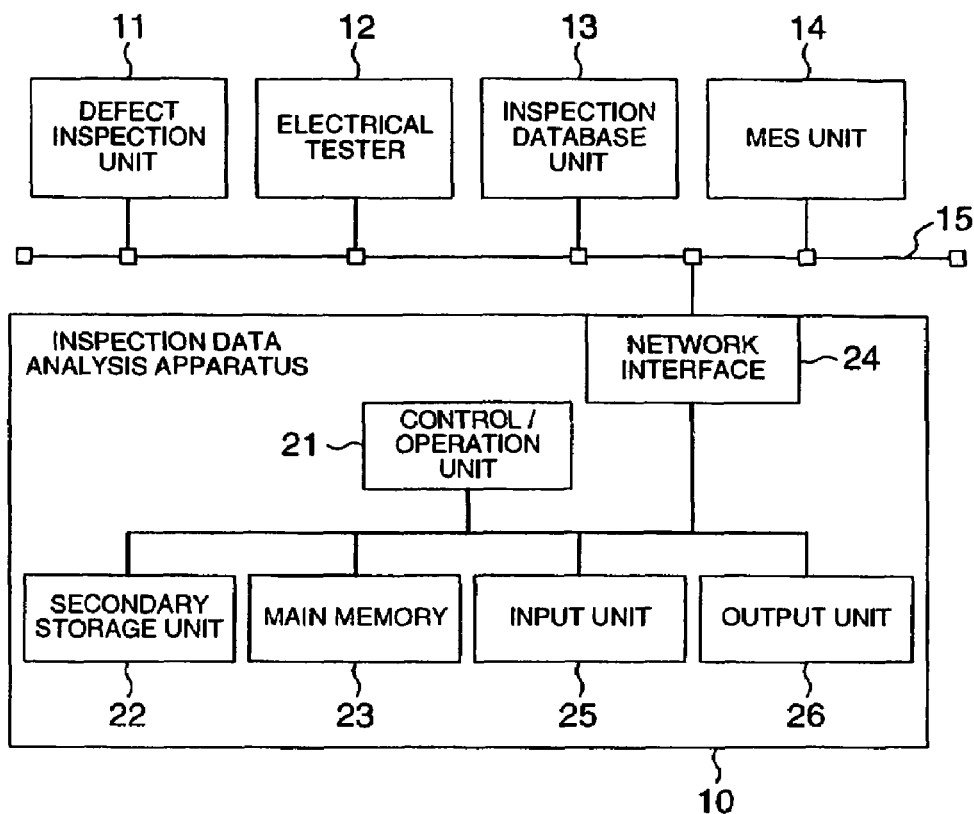
FIG. 1 is a block diagram showing an example of an inspection data analysis apparatus and its related equipments.

Part of the aforementioned system is illustrated in FIG. 1.

The inspection data analysis apparatus 10 includes a control/operation unit 21, a secondary storage unit 22, a main memory 23, a network interface 24, an input unit 25 and an output unit 26. The network interface 24 is connected to the local area network 15 to permit the apparatus 10 to conduct data analysis by reading inspection and test results stored in the inspection database unit 13 and process history data stored in the MES unit 14.

A list of units used in production of a wafer of a product is stored as process history data in the MES unit 14. An example of the process history data is shown in FIG. 9. Data 147 corresponds to process history data of a wafer having a wafer ID of A003. It will be seen that this wafer was processed for a LOCOS surface oxidation step at 10 o'clock on Dec. 5, 2002 by unit code 111, that is, the No. 1 diffusion unit. The wafer was subsequently processed for a LOCOS film formation step at 15 o'clock on Dec. 5, 2002 by unit 32, that is, the No. 2 CVD unit. Thereafter the wafer went through various processing steps as identified by the hours, dates, and units indicated in the data 147.

The secondary storage unit 22 stores, in advance, an analysis program which in turn is read from the secondary storage unit 22 to the main memory 23 and executed under the direction of the control/operation unit 21. This causes the inspection data analysis apparatus 10 to perform the process illustrated in FIG. 14.

Data representative of results of inspection and measurement by the defect inspection unit 11, dimension measurement unit 131, film thickness measurement unit 132 and alignment inspection unit 133, as well as test results obtained by the electrical tester 12 are stored in the inspection database unit 13 and transmitted through the local area network 15.

Figures 6, 7:
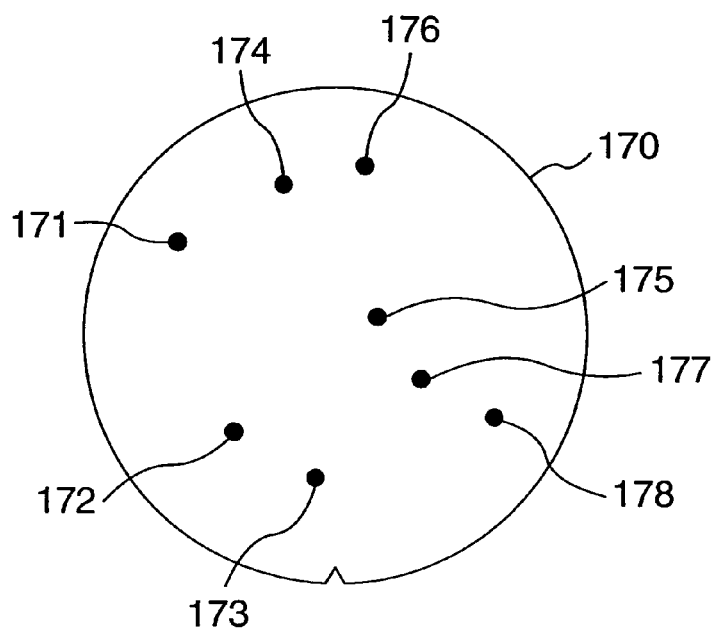
FIG. 6 is a diagram showing an example of inspection data.
FIG. 7 is a diagram showing an example of inspection data visually illustrated in the form of a wafer map.

The inspection database unit 13 representing an external secondary storage unit also stores inspection data used in equipment QC. The stored inspection data is shown in FIG. 6. Data 143 corresponds to results of inspection of a unit code 31, that is, the No. 1 CVD unit which was subjected to equipment QC at 10 o'clock and 18 o'clock on Feb. 1, 2003. The data 143 indicates that 8 particles and provides their size and 10 coordinates on the wafer surface. An example of a visual wafer map of the coordinates of particles indicated in the data 143 is shown in FIG. 7. In FIG. 7 a circular enclosure 170 indicates the wafer and coordinates corresponding to defect ordinal numbers 1 to 8 in the data 143 are plotted at 171 to 178. In this manner, from the coordinate information of defects, positions of the defects on the wafer surface can be ascertained.

Figure 8:
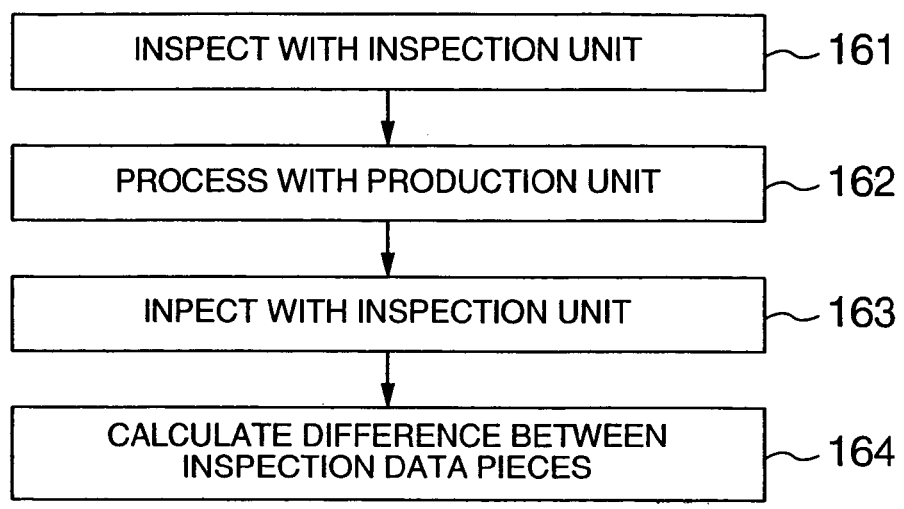
FIG. 8 is a flowchart showing an example of a process procedure for equipment QC.

Referring now to FIG. 8, there is shown an example of a procedure for equipment QC carried out to obtain the data 143. In the equipment QC, the wafer is first inspected by means of the defect inspection unit 11 in step 161. Next, in step 162, the wafer inspected in step 161 is subjected to the same process or step as that used to form a product by means of an it's respective production units. This can be any of the CVD units 31 and 32, coating/development units 41 and 42, exposure units 51 to 54, etching units 61 to 63, ion planter units 71 and 72, washing units 81 to 83, resist removal units 91 to 93, sputter units 101 and 102, diffusion units 111 and 112 and CPM units 121 and 122. Subsequently, in step 163, the same wafer is again inspected with the defect inspection unit 11. Finally, in step 164, a difference between the result of inspection in step 163 and the result of inspection in step 161 is calculated. According to one exemplary, difference calculation method, coordinates of particles detected in step 163 are compared with coordinates of particles detected in step 161, and the particles whose coordinates match with those of particles detected in step 1612, are removed from particles detected in step 163 to obtain data 143. In this case, sizes detected in step 163 are described as the particle sizes in the data 143.

Stored in the inspection database 13 are an electrical test result shown in FIG. 10 and incidental data as shown in FIG. 11. The electrical test result 144 describes product name, wafer ID, test date, yield, defect density converted from yield or non-defective/defective decision results with respect to individual chips in a product wafer. Incidental data 145 describes information including a chip size of a product exhibiting the electrical test result 144, how to interpret non-defective/defective decision result and matrix of the chip on the wafer. For example, the incidental data is 145 defines that the product name is ABC, the chip size is 10 mm longitudinally (Y) and 10 mm laterally (X). The electrical test result exhibits mark "G" indicative of non-defective chip and mark "B" indicative rive of defective chip. Mark "–" signifies a portion where no chip exists on the wafer. For the data 144, the defect density is calculated using a yield model expression pursuant to equation 1. This model is based on the assumption that defects leading to electrical failures take place at random positions.

$$Y = e^{-DA} \tag{1}$$

Figure 12:
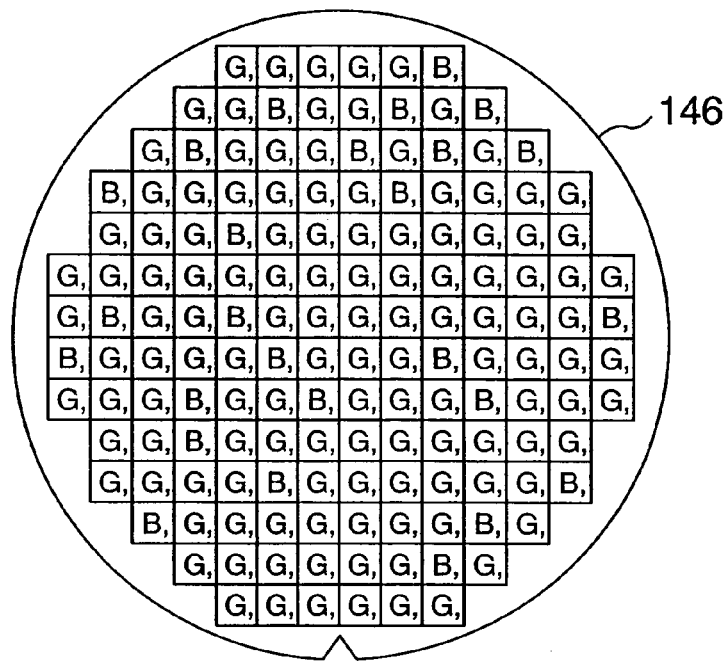
FIG. 12 is a diagram showing an example of electrical test results visually illustrated in the form of a wafer map.

In equation 1, Y represents yield, D represents defect density (the number of defects leading to electrical failures per unit area) and A represents an area of a product chip. The defect density D can be determined from the yield Y and product chip area A. The yield in the data 144 is a value obtained by dividing a "G" chip number (i.e., the number of "G" chips) by the sum of "G" and "B" chip numbers (i.e., the number of "G" chips and the number of "B" chips). The area A of the product chip is a value calculated from the chip size described in the incidental data 145. An example of a visual wafer map of the electrical test result 144 is illustrated in FIG. 12. In FIG. 12, a circular enclosure 146 represents the wafer and a number of squares indicate chips of the product.

Figure 14:
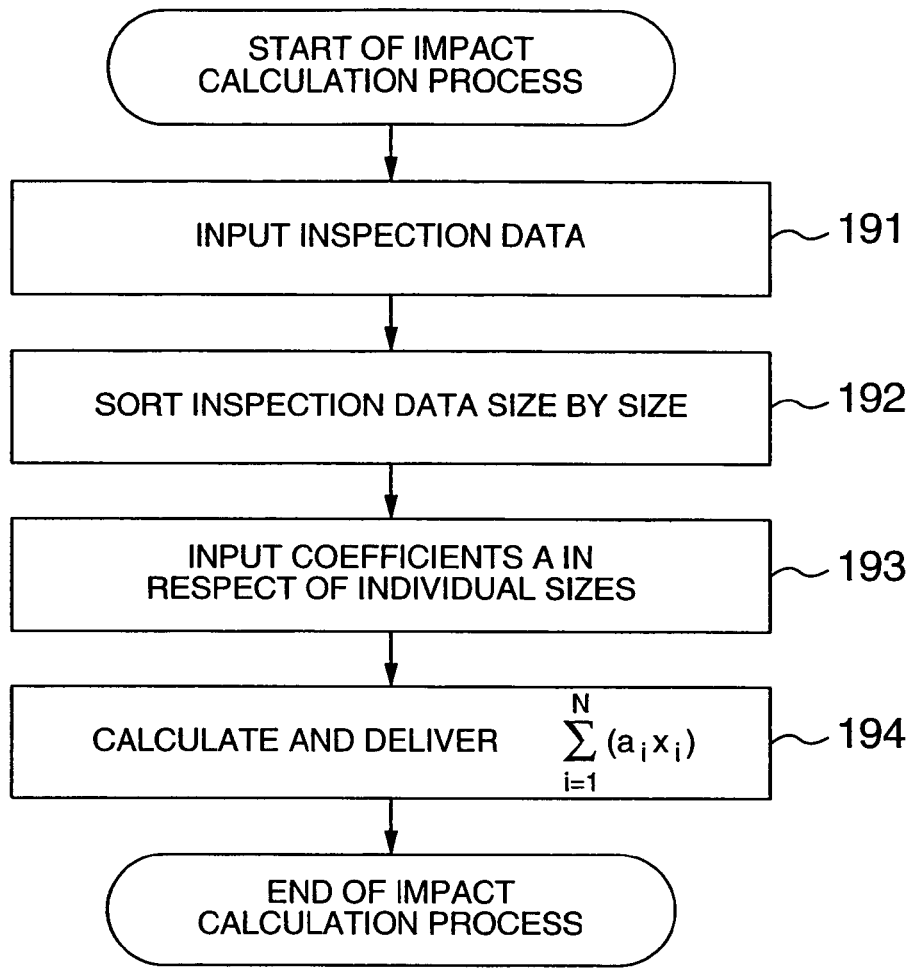
FIG. 14 is a flowchart showing an example of a process procedure for calculating an impact on a product.

Referring now to FIG. 14, an exemplary procedure for calculating an impact on the product by particles generated in a production equipment representing an object of equipment QC will be described.

In step 191, inspection data for equipment QC described as data 144 in FIG. 10 is read from the inspection database unit 13 to the inspection data analysis apparatus 10 through the local area network 15.

In step 192, the inspection data inputted in step 191 is sorted in accordance with particle sizes. Sorting is based on three classes depending on sizes of: less than 0.5 micrometer, 0.5 micrometer or more but less than 1.0 micrometer and 1.0 micrometer or more. This type of classification is the same as that for the conventional in-line inspection results. If this classification has already been done, it is not carried out.

In step 193, coefficients determined with respect to individual particle sizes concomitant with the object tool and stored in the secondary storage unit 22 are read.

In step 194, the inspection data pieces sorted in the step 192 are multiplied by the coefficients read in the step 193 with respect to the individual sizes, and the products are summed pursuant to equation 2.

$$D = \sum_{i=1}^{N} (a_i x_i) \tag{2}$$

In equation 2, D represents defect density indicative of an impact on the product and N is the number of classes for the individual sizes. As described above, the sizes are sorted into three classes and therefore, N=3 stands. The coefficients read in the step 193 are represented by $a_i$, with $a_1$ being a coefficient for less than 0.5 micrometer, $a_2$ being a coefficient for 0.5 micrometer or more but less than 1.0 micrometer or less and $a_3$ being a coefficient for 1.0 micrometer or more in size. The inspection data sorted in the step 192 is represented by $x_i$, with $x_1$ being the number of particles of less than 0.5 micrometer in their sizes, $x_2$ being the number of particles of 0.5 micrometer or more but less than 1.0 micrometer or less in their sizes and $x_3$ being the number of particles of 1.0 micrometer or more in their sizes.

The sum indicates the impact on the product by the particles occurring in the production equipment representing an object of equipment QC and is delivered to the output unit 26.

For delivery of the sum, the impact may be delivered to the output unit 26 each time that the equipment QC is conducted or alternatively. Plural impacts may be calculated and their lapse may be delivered. Preferably, a standard value may be set in advance in the secondary storage unit 22. The standard value (threshold) may be compared with impacts and only an impact in excess of the standard value may be outputted to the output unit 26, thereby ensuring that the number of data pieces to be analyzed by the user can be advantageously reduced. Further, various outputs may be delivered so that an output for commanding a review apparatus to review a wafer for which the standard value exceeds may be delivered to the review apparatus. A command for changing the inspection condition in the inspection tool may be delivered or an output for commanding a yield analysis apparatus to calculate a yield of a wafer for which the standard value exceeds may be delivered to the yield analysis apparatus. This makes it possible to assure highly efficient countermeasures against failures.

In the present embodiment, the impact is not expressed in terms of yield but is expressed in terms of defect density because for the same defect density, because the yield differs depending on the chip type and sizes of products. By expressing the impact in terms of the defect density, the result of equipment QC can be interpreted with respect to the same reference even when products of different chip sizes are produced on the manufacturing line.

Next, the program stored in the secondary storage unit 22 to be used for determining the coefficients will be described.

Figure 4:
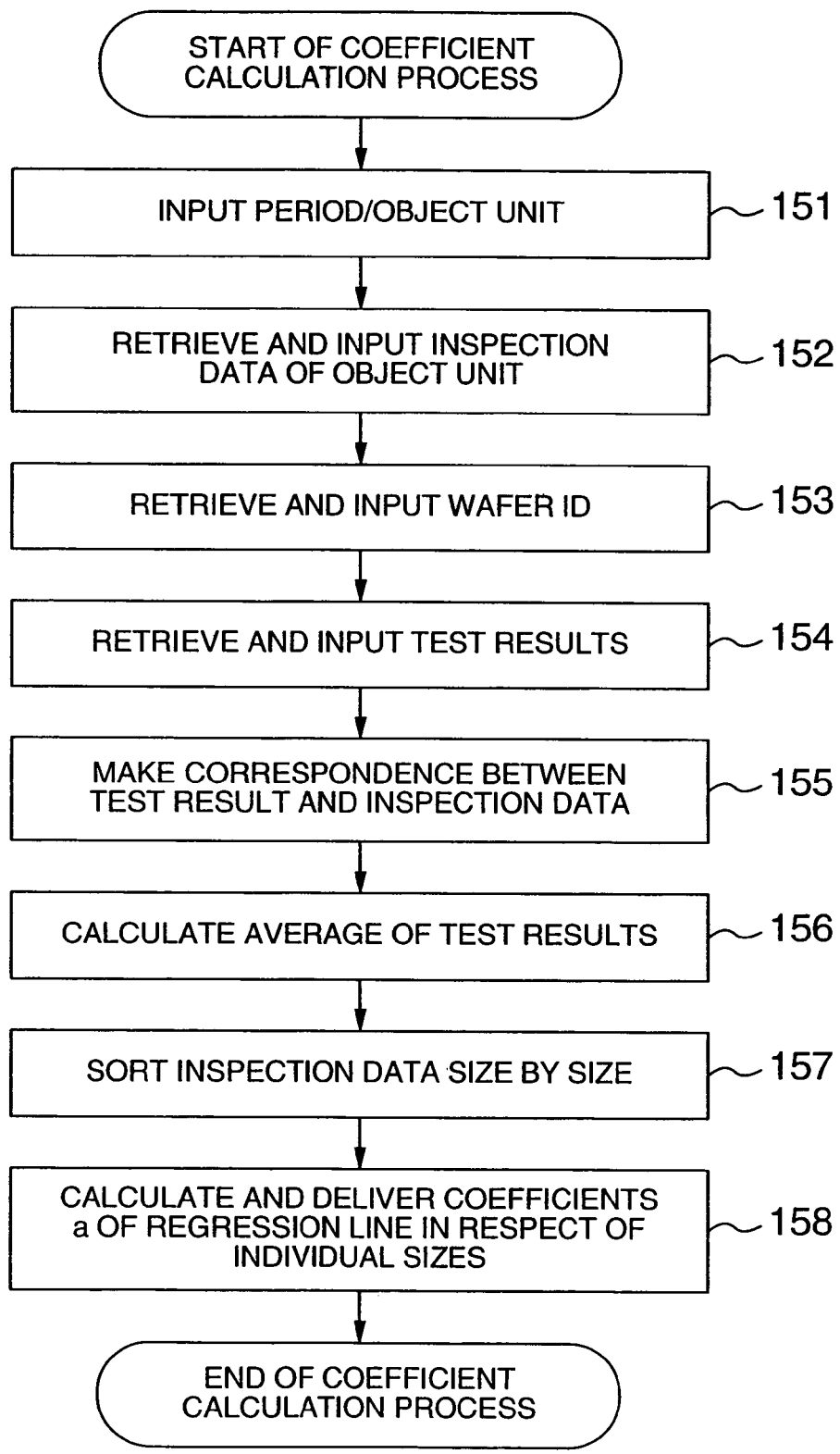
FIG. 4 is a flowchart showing an example of a process procedure for calculating coefficients in the invention.

A flow of that program is shown in FIG. 4.

Firstly, in step 151, the input unit 25 receives an input of period and object equipment from a user. Instead of receiving the input directly from the user, the input may be registered in advance in the secondary storage unit 22 and may be read therefrom. For example, as the period, a period ranging from past 1$^{st}$ of February to 7$^{th}$ of February is inputted and as the object equipment, the Nos. 1 and 2 CVD units are inputted in terms of their equipment (unit) codes. For equipment codes, a list 142, for example, shown in FIG. 5 and adapted to uniformly or definitely define the correspondence between equipment (unit) name and code ordinal number is stored in advance in the secondary storage unit 22 and by making retrieval on the basis of the list, an equipment code can be inputted automatically.

Next, in step 152, based on the period and object equipment inputted in step 151, inspection data is retrieved from the secondary storage unit connected through the network interface 24 and inputted to the main memory. In case a plurality of inspection data pieces in question are involved, all of them are inputted.

Next, in step 153, a wafer ID of a product manufactured using the object equipment is retrieved and inputted. The wafer ID is a number or mark for identifying each wafer of the product.

Next, in step 154, a result of the electrical test is retrieved from the inspection database 13 based on the wafer ID and inputted to the inspection data analysis apparatus 10 through the local area network 15.

Subsequently, in step 155, the correspondence is made between the electrical test result and the inspection data. Essentially, the individual inspection data pieces obtained from the equipment QC conducted in accordance with the procedure shown in FIG. 8 are made to correspond with the electrical test result of the product wafer processed using the object production equipment during a period (time) including time at which the equipment QC is conducted. For example, in case equipment QC is carried out once a day and equipment by equipment, the individual electrical test results of a plurality of product wafers processed on the same day by using the object equipment are made to correspond with the inspection data.

Next, in step 156, an average of the plural electrical test results made to correspond with the inspection data in step 155 is calculated with respect to the individual inspection data pieces. The average of the electrical test results is an average of the defect densities described in the data 144. Through this step, the correspondence between the inspection data and the average of the electrical test results can be made with respect to the individual inspection data pieces.

Next, in step 157, the inspection data obtained in the equipment QC is sorted into several classes on based sizes of particles. For example, the inspection data 143 as shown in FIG. 6 is sorted into three classes according to the particle sizes of less than 0.50 micrometer, 0.50 micrometer or more but less than 1.0 micrometer and 1.0 micrometer or more. In the data 143, the sorting of the particles is done such that 3 particles are obtained for the size of less than 0.50 micrometer, 3 particles are obtained for the size of 0.5 micrometer or more but less than 1.0 micrometer or less, and 2 particles are obtained for the size of 1.0 micrometer or more.

Figure 13:
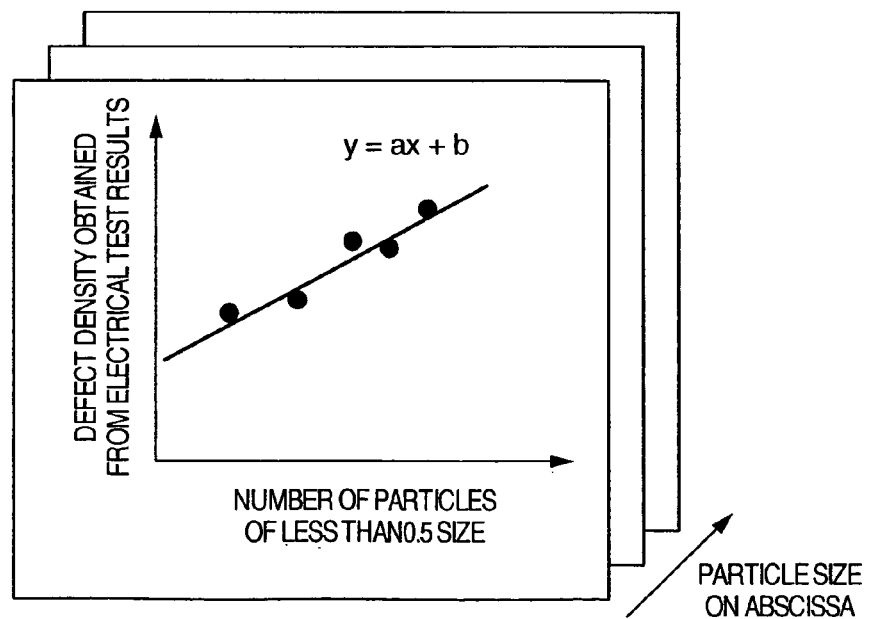
FIG. 13 is a graphical representation showing an example of scatter plots used to calculate coefficients.

Next, in step 158, gradient coefficients of a regression line in a scatter plot graph having its abscissa representing particle number (i.e., the number of particles in the inspection data) and its ordinate representing an average of the electrical test results are calculated with respect to individual particle sizes and stored in the secondary storage unit 22. An example of an illustration of the scatter plot graph for calculation of the regression line is depicted in FIG. 13. In the scatter plot graph, a piece of inspection data of the equipment QC and an average of electrical test results are paired to provide one plot. Consequently, gradient coefficients can be calculated for different particle sizes.

Through a similar procedure, QC is conducted for various equipments shown in FIG. 2 so that coefficients different from individual equipments and particle sizes may be calculated and stored in the secondary storage unit 22.

Incidentally, in the aforementioned process, the defect density calculation method uses the model expressed by equation 1. This model is based on the assumption that defects take place at random positions. But, failures determined by the electrical inspection results are not always necessarily generated at random positions in the wafer surface. Failures are often generated at non-random positions in the front-end production process in such a manner that, for example, failures are generated densely in the vicinity of a notch which is a reference point of a wafer or failures are generated densely in the middle of the wafer. In such a case, the defect density can be calculated more accurately by equation 3 than by equation 1 if equation 3 is calculable.

$$Y = Y_s \cdot Y_r = Y_s \cdot e^{-DA} \qquad (3)$$

In equation 3, Yr represents yield restricted by failures generated randomly and Ys represents yield restricted by failures generated non-randomly. The product of the two indicates ultimate yield Y. The yield Y can be determined easily from the data 144. But decomposition of the yield Y into Ys and Yr is difficult to achieve.

In the foregoing embodiment, the coefficients are calculated for individual particle sizes in the process of FIG. 4 and the inspection data pieces are sorted for individual particle sizes in the process of FIG. 14. But, some of the defect inspection tools cannot deliver the size of particle. Accordingly, in the event that the particle size cannot be delivered, the inspection data may be utilized without being sorted with respect to individual particle sizes. More specifically, steps 157 and 158 are not executed in FIG. 4 and in a step next to step 156, particle numbers of all sizes (values of the number of particles of all sizes) are plotted on the abscissa, defect densities determined from electrical test results are plotted on ordinate. One regression line is calculated to deliver one coefficient. Further, in FIG. 14, steps 192, 193 and 194 are not executed and in a step next to step 191, one coefficient is inputted, the product of a particle number inputted in step 191 and one coefficient is calculated to deliver an impact on a product, thereby ensuring that the impact can be calculated although the calculation accuracy is low.

As described above, the impact on a product can be calculated from the inspection data detected in the equipment QC and it is possible to decide on the basis of a value of the impact whether a measure to reduce particles generated in the object tool is to be taken or not.

Further, in the foregoing embodiment, the inspection data analysis apparatus has been described as being independent but it may be carried on the inspection unit, yield analysis unit, review unit or electrical tester.

In carrying the apparatus on the inspection tool, transmission/reception of inspection data is unneeded. Further, when the impact is larger than the threshold, the inspection condition is changed.

In carrying the apparatus on the review tool, the frequency of review is increased when the impact is larger than the threshold.

The electrical characteristic test is to inspect all products, resulting in a drastically increased amount of data and therefore, carrying the apparatus on the electrical tester is preferable because the amount of transmitting/receiving data can be reduced to a great extent.

As has been described, according to the present invention, the impact on the product by the inspection data of each production equipment can be grasped quantitatively. As a result, it is possible to decide whether care is to be taken regarding a subject equipment.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An analysis program embodied on a computer readable medium for analyzing inspection data of equipment QC (quality control) executed by means of an operation unit, said program comprising the following processes:

reading out to a main memory first inspection data representative of a result of equipment QC applied to a particular production equipment, said equipment QC being an inspection on the production equipment to evaluate particles or defects produced on a substrate with no electrical circuits passing through said production equipment to obtain the inspection data;

reading out from a secondary storage unit coefficients indicating relationship between defect density on a substrate of product with electrical circuits and the number of particles or defects on the substrate with no electrical circuits, wherein said coefficients are dependent on individual production equipment and each particle size group or defect size group, said coefficients have been previously calculated and stored in said secondary storage unit from a scatter plot graph represented by the number of particles or defects in the individual particle size group or defect size group determined from second inspection data by determining a gradient of a regression line of the number of particles or defects and defect densities, said second inspection data is representative of a result of equipment QC applied to the production equipment using a substrate with no electrical circuits, and said electrical test data represents a result of an electrical test on a tester to evaluate a yield of a substrate of a product with electrical circuits passed through the production equipment in a time period in which said second inspection data was obtained;

calculating a defect density indicative of an impact on substrates of product due to particulates or defects produced in the production equipment at a time when the equipment QC is made on the production equipment to obtain the first inspection data, by summing up said coefficients corresponding to the particle or defect size group of each particle or defect of the first inspection data; and outputting results from the calculating process.

* * * * *